United States Patent [19]
Beckett

[11] Patent Number: 5,266,386
[45] Date of Patent: Nov. 30, 1993

[54] DEMETALLIZING PROCEDURE

[75] Inventor: D. Gregory Beckett, Oakville, Canada

[73] Assignee: Beckett Industries Inc., Oakville, Canada

[21] Appl. No.: 817,648

[22] Filed: Jan. 7, 1992

Related U.S. Application Data

[62] Division of Ser. No. 655,022, Feb. 14, 1991, abandoned.

[51] Int. Cl.$^5$ .............................................. B32B 9/02
[52] U.S. Cl. .................................. 428/209; 428/457; 428/901; 428/201; 428/202
[58] Field of Search ............... 428/901, 457, 458, 195, 428/209, 332, 201, 202; 430/417

[56] References Cited

U.S. PATENT DOCUMENTS 4,329,396  5/1982  Kropp ................................ 428/354
4,555,414  11/1985 Hoover ............................. 427/43.1
5,108,822  4/1992  Imaichi ............................. 428/209

*Primary Examiner*—Patrick J. Ryan
*Assistant Examiner*—Patrick Jewik
*Attorney, Agent, or Firm*—Sim & McBurney

[57] ABSTRACT

Selective demetallization of an etchable metal film supported on a polymeric material or other microwave transparent material, particularly an etchable metal film, particularly aluminum, of thickness at least about 1 micron adhesively joined to a flexible polymeric material substrate, is described. A web of metallized polymeric material has a pattern of etchant-resistant material first applied and then the web is immersed in and passed through a bath of aqueous etchant, particularly hot aqueous sodium hydroxide solution, for a time at least sufficient to completely remove the etchable metal from non-protected areas of the web. The demetallized web is washed and dried.

4 Claims, 1 Drawing Sheet

DEMETALLIZING PROCEDURE

This is a divisional of application Ser. No. 655,022 filed Feb. 14, 1991, now abandoned.

FIELD OF INVENTION

The present invention is directed towards the demetallization of etchable metal supported on a web of microwave transparent material.

BACKGROUND TO THE INVENTION

In U.S. Pat. No. 4,398,994, assigned to the assignee hereof and the disclosure of which is incorporated herein by reference, there is described a continuous method of forming decorative patterns of aluminized plastic film and the use of such patterned film in packaging.

As described therein, a web of aluminized polymer film is printed with a pattern of etchant-resistant material, corresponding to the pattern desired to be retained on the aluminized surface. Aqueous sodium hydroxide solution is applied to the patterned film to etch away the exposed aluminum while the aluminum covered by etchant-resistant material is untouched.

In U.S. Pat. No. 4,552,614, assigned to the assignee hereof and the disclosure of which is incorporated herein by reference, there is described an improved procedure to effect such selective demetallization by employing spray application of the aqueous etchant to the patterned aluminized surface.

More recently in U.S. Pat. No. 4,869,778, it has been proposed to form a micropattern on the aluminized surface by first contacting the patterned aluminized polymeric film with a warm, essentially saturated caustic solution followed by contact with an acidic solution and washing.

The procedures described in the aforementioned prior art are very effective in achieving selective demetallization of relatively thin aluminum layers (generally less than about 1000 Å in thickness) supported on a polymeric web to completely remove aluminum from selected areas of the surface of the polymeric web for a variety of purposes, such as in decorative packaging and in microwave susceptor applications. The procedures, however, are less effective with relatively thick aluminum layers supported on a polymeric material web because of rapid depletion of the etchant by the etched material.

SUMMARY OF INVENTION

In accordance with one aspect of the present invention, there is provided a method of effecting selective demetallization of an etchable metal supported on a microwave transparent material substrate, generally a polymeric film substrate, which comprises applying a pattern of etchant-resistant material to the etchable metal corresponding to a desired pattern of non-etched metal, repeatedly contacting the etchable metal with an aqueous etchant material for a time at least sufficient to effect complete removal of the etchable metal from areas of the polymeric film substrate not covered and protected by the pattern, and washing spent etchant solution from the resulting etched polymeric film substrate.

By providing prolonged exposure of the etchable metal to aqueous etchant by way of such repeated contact, relatively thick layers of etchable metals, such as aluminum, can be processed by the procedure of the present invention to effect selective demetallization.

The prolonged exposure and repeated contact preferably is carried out by immersing the patterned metallized polymeric film substrate in a bath of etchant and maintaining it immersed until complete removal of etchable metal from the non-protected areas is effected.

For reasons of economy, it is preferred to operate the process in a continuous manner, with a web of polymeric material supporting a layer of etchable metal on at least one face thereof being processed continuously through the steps of pattern application, demetallization and washing.

The invention is particularly applicable to etchable metal of a thickness of at least about 1 micron, preferably aluminum, although the method is equally applicable to other etchable metals of differing thicknesses. The etchable metal may be supported on the microwave transparent substrate, generally a polymeric film substrate, either by direct engagement, such as is achieved by vapor depositing the metal on the polymeric substrate, or by adhesive bonding of the metal to the polymeric film substrate. The latter structure is more usual with the thicknesses of metal with which the present invention is particularly concerned.

In a preferred embodiment of the invention, there is provided a continuous method of effecting selective demetallization of a layer of aluminum having a thickness of at least about 1 micron supported on a web of flexible polymeric material, which comprises continuously applying a pattern of sodium hydroxide-resistant material to the aluminum corresponding to a desired pattern of non-etched aluminum, continuously passing the patterned web in an immersed condition through a bath of aqueous sodium hydroxide solution having a temperature of about 50° to about 90° C. and a strength of about 0.25 to about 8 normal for a time of at least 0.5 secs. per micron thickness of the aluminum to effect complete removal of aluminum from areas of the web not covered and protected by the pattern, continuously washing the web free from spent sodium hydroxide solution, and drying the washed web.

Following drying of the web, it is preferred to apply a detackifying material to the exposed adhesive. This preferred operation results in a novel laminate structure, which constitutes a further aspect of the invention. In accordance with this aspect of the present invention, there is provide an apparatus for effecting selective demetallization of a layer of etchable metal supported on a web of flexible polymeric material, comprising an elongate tank adapted to hold a bath of aqueous etchant material and having an upstream end and a downstream end, means enclosing the elongate tank to provide an enclosure open only at the upstream end and downstream end to permit the web to enter and leave the tank, and guide means located within the tank and arranged to guide the web generally horizontally through the elongate tank from the upstream end to the downstream end below the intended level of the bath of etchant material, the guide means further being adapted to engage the web in driving relation to drive the web through the tank.

The present invention provides, in another aspect of the invention, an apparatus for effecting the preferred method of the present invention as described above, comprising a novel laminate structure comprising a flexible polymeric substrate layer, a layer of adhesive coextensive with the substrate, a layer of an etchable metal having a thickness of at least about 1 micron overlying the substrate layer and the adhesive layer in a pattern, a layer of etchant resistant material overlying the etchable metal layer in the same pattern, and a layer of detackifying material overlying the adhesive layer in regions thereof not overlied by the etchable metal layer.

DESCRIPTION OF PREFERRED EMBODIMENT

Figure 1:
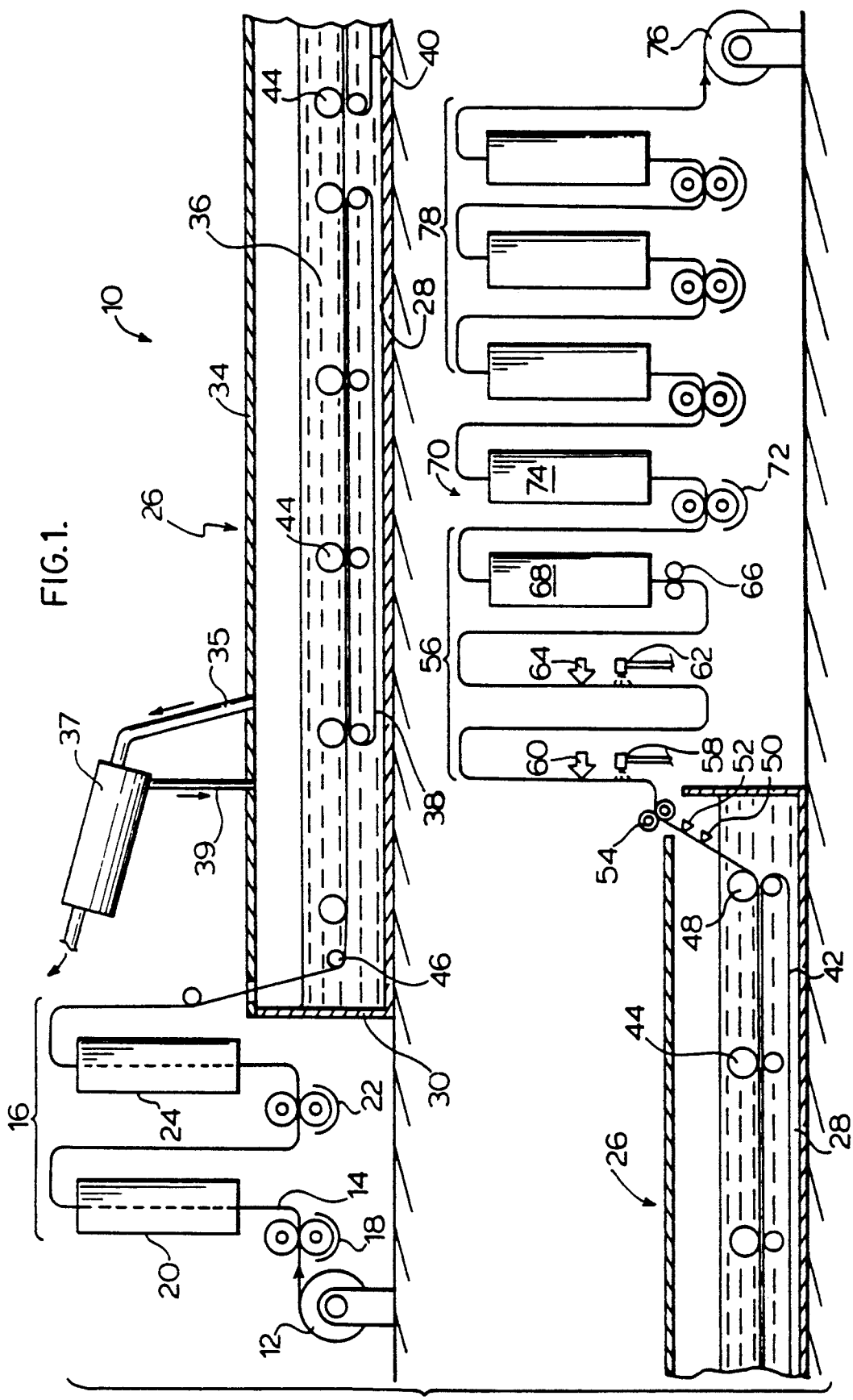
FIG. 1 is a schematic representation of one embodiment of apparatus which may be employed to effect the method of the invention.

Referring to the drawing, a selective demetallizing machine 10 comprises a plurality of stations to effect selective demetallizing of metallized flexible polymeric film. A roll 12 of such film generally comprises aluminum of thickness of at least about 1 micron, usually up to about 15 microns, preferably about 3 to about 10 microns, typically aluminum foil of thickness about 7 to 8 microns, adhesively bonded to one face of the polymeric film.

A web 14 of the flexible polymeric film substrate supporting the aluminum layer is drawn from the roll 12 and passed to a protective lacquer applying station 16, wherein a pattern of etchant-resistant material is applied to the aluminum layer by a first applicator 18 before the pattern is dried by a first drier 20. The pattern of etchant-resistant material is applied to areas of the aluminum surface which it is desired to retain in the subsequent selective demetallization procedure. In view of the prolonged exposure of the web 14 to the etchant, it is usually desirable to apply the pattern a second time to ensure a sufficient thickness of lacquer on the aluminum surface to resist the etchant. Accordingly, the web 14 passes, after the first drier 20, through a second etchant-resistant material applicator 22 and a second drier 24, before passing to an etching station 26.

The etching station 26 comprises an elongate horizontal tank 28 through which the patterned web 14 passes from an upstream end 30 to a downstream end 32. The tank 28 is provided with an upper closure 34 to prevent significant evaporative losses from the tank 28. The interior of the tank 28 may be maintained under a slightly subatmospheric pressure to avoid loss of moisture through the end gaps between the upper closure 34 and the tank end walls through which the web is required to pass to enter and exit the tank 28. For this purpose, a conduit 35 to which a subatmospheric pressure is applied may communicate with the atmosphere above the liquid level in the tank, with an associated scrubber 37 to remove moisture for return to the tank 28 through line 39.

The tank 28 holds a bath 36 of aqueous etchant material, usually aqueous sodium hydroxide solution for aluminum as the etchable metal. The aqueous sodium hydroxide solution generally is maintained hot to enhance rapid etching of the exposed aluminum metal, usually in the range of about 50° to about 90° C., preferably about 70° to about 75° C. The strength of the sodium hydroxide solution may vary widely, usually from about 0.25 to about 8 normal, with the stronger solutions in the range of about 2 to about 3 normal, being preferred to enhance rapid etching of the exposed aluminum.

Three endless driven belts 38, 40 and 42 (only parts of belts 40 and 42 are shown) are provided immersed in the bath 36 of, aqueous sodium hydroxide solution and formed of a suitable etchant-resistant material, for example, stainless steel mesh. The driven belts 38, 40 and 42 each has a series of roller elements 44 located in close proximity to the upper surface of the respective belt, so that the web 14 passing between the roller elements 44 and the adjacent upper belt surface is engaged by both, to ensure driven engagement of the web 14 by the respective belt. Although three endless belts 38, 40 and 42 are illustrated, any convenient number of such belts may be provided. Any other convenient drive mechanism may be employed to drive the web 14 through the tank 28.

The web 14 enters the tank 28 at its upstream end 30 and is immersed in the bath 36 by passing over a guide roller 46. The web 14 then passes in a generally horizontal path through the tank 28 immersed in the bath 36 to a guide roller 48 and out of the tank 28 at the downstream end 32. During passage through the tank 28, the web 14 is driven by the conveyer belts 38, 40 and 42.

In the prior art of U.S. Pat. No. 4,552,614 referred to above, the web is driven through the apparatus by a drive roller located at the downstream end of the demetallizing tank. However, the additional dwell time required for the generally thicker aluminum layers with which the present invention is concerned necessitates that the web be positively driven through the tank 28 rather than drawn, to avoid inordinate stretching and distortion of the web.

As the web 14 passes through the tank, the hot aqueous alkali etches the exposed aluminum and removes it from areas of the web not protected by the etchant-resistant material. Since the web 14 remains submerged during its passage through the tank 28, the web is continuously in contact with fresh hot sodium hydroxide solution.

The speed of movement of the web 14 through the tank 28, the length of tank 28 and the temperature and strength of the aqueous sodium hydroxide solution are coordinated to provide a dwell time of the web 14 in contact with the hot aqueous sodium hydroxide solution of at least about 0.5 secs. per micron of thickness of metal, preferably in the range of about 5 to about 10 secs per micron of thickness of metal, so as to ensure that the metal is completely etched from the exposed areas of the web.

The rate of movement of the web 14 through the tank may vary widely, but generally higher speed operations are preferred in the interests of economy, generally up to about 350 meters/min, preferably about 150 to about 250 meters/min.

As etching of the web 14 continues in the tank 28, etched aluminum becomes dissolved in the aqueous sodium hydroxide solution and tends to build up in the solution. The bath may be intermittently, or more preferably, continuously rejuvenated by appropriate processing of the solution to remove the dissolved aluminum and regenerate the alkali. The process may be operated with a dissolved aluminum concentration in the bath 36 which may vary widely, generally from about 5 to about 95% of aluminum saturation of the bath, preferably towards the lower end of this range, from about 15 to about 30%.

The dissolved aluminum may be removed from the aqueous etchant solution and the alkali regenerated in any convenient manner to maintain a closed-loop for the alkali. One particular procedure which can be adopted involves removal of dissolved aluminum by crystallization of aluminum trihydrate. During reaction in the tank 28, the caustic soda forms sodium aluminate, which then is converted to aluminum hydroxide and sodium hydroxide by hydrolysis in a regeneration operation outside the tank 28. This procedure is described in an article by Dejat entitled "Aluminum Anodizer Regenerates Caustic Etch Solution" published in Plating and Surface Finishing, April 1984.

After the etched web leaves the bath 36 at the downstream end of the tank 28 but before the web leaves the tank 28, the web 14 engages a first doctor blade 50 and then a second doctor blade 52 to wipe off liquid etchant from the surfaces of the web, and retain such liquid in the tank 28, before passing between rollers 54.

The demetallized web then passes to a washing and drying station 56. The demetallized web has wash water sprayed on by first wash water sprayers 58 followed by wiping of the washed surface by a first wiper blade 60, and then has wash water sprayed on again by second wash water sprayers 62 followed by wiping of the washed surface by a second wiper blade 64. The washed demetallized web is passed between a pair of rolls 66, which comprise a rubber pinch roll to squeeze the web into engagement with a metal surfaced drive roll to ensure a positive pulling drive is effected on the web 14 through the washing operation. The pair of rollers 66 also serve to remove surface water from the web.

Spent wash water from the washing operations may be recycled to the tank 28 to make up for evaporative losses, as required. Following washing of the etched web in this way, the washed, clean patterned web is dried by passing through a drier 68, which removes residual surface moisture from the web.

Where the web 14 comprises an aluminum layer adhesively bonded to the polymeric film layer, the selective demetallization exposes the adhesive in the regions of the web which are demetallized. This adhesive tends to be somewhat tacky and hence the dried demetallized web next is passed to a detackifying station 70, where the web first is contacted with a detackifier of suitable composition by an applicator 72 and then is dried by passing through a drier 74.

Optionally, prior to winding up the web into a reel 76, the web may be passed through an in-line print station 78, where one or more colors, for example, three as illustrated, may be applied to the web in a desired pattern.

The reel 76 of processed web is formed on a wind-up roll which is drivingly rotated to draw the web through the drying, detackifying and optional coloring operations.

The demetallizing machine 10 may be used to effect selective demetallization of aluminum and other etchable metals generally in relatively thick layers supported by the polymeric web over a wide range of speeds of operation, as mentioned above.

The demetallizing machine 10 may be used to effect selective demetallization for a variety of purposes. For example, the demetallizing operation may be effected to produce materials useful in microwave packaging applications, such as described in my copending U.S. patent application Ser. No. 535,168 filed Jun. 8, 1990, now abandoned, ("Amaze-met"), the disclosure of which is incorporated herein by reference. The demetallizing machine 10 also may be employed to form other selectively demetallized elements comprising a pattern of electroconductive material adhered to a polymeric material layer, such as circuit boards and elements useful as carpet heaters.

The demetallizing operation carried out in the tank 28 employs continuous immersion of the patterned web to effect complete removal of aluminum from the unprotected portions of the web surface. Any other equivalent procedure may be adopted, however, to ensure that there is repeated contact of etchant with the web for at least 0.5 secs. per micron of metal thickness on the web. For example a series of longitudinally-spaced spray applicators may be employed.

SUMMARY OF DISCLOSURE

In summary of this disclosure, the present invention provides a novel selective demetallization procedure particularly suited for relatively thick films of etchable metals by employing a relatively long contact time between the etchant and metal. Modifications are possible within the scope of this invention.

What I claim is:

1. A novel laminate structure, comprising:
   a flexible polymeric substrate layer resistant to aqueous sodium hydroxide solution etchant,
   a layer of adhesive coextensive with said substrate resistant to aqueous sodium hydroxide solution etchant,
   a layer of an etchable metal comprising aluminum having a thickness of about 1 to about 15 microns overlying said adhesive layer in a pattern,
   a layer of aqueous sodium hydroxide solution etchant-resistant material overlying said etchable metal layer in the same pattern as said etchable metal layer, and
   a layer of detackifying material overlying said adhesive layer in regions thereof not overlied by said etchable metal layer.

2. The laminate of claim 1 which is formed by:
   effecting selective demetallization using an aqueous etchant of a laminate of a continuous layer of said etchable metal of thickness of about 1 to about 15 microns adhesively joined to and coextensive with said flexible polymeric material layer by said adhesive layer to which said pattern of etchant-resistant material has been applied so that said aqueous etchant completely removes metal in said etchable metal layer not protected by said etchant-resistant material, and
   subsequently applying said layer of detackifying material to the portion of said adhesive layer exposed by said selective demetallization.

3. The laminate of claim 1 wherein said etchable metal has a thickness of about 3 to about 10 microns.

4. The laminate of claim 3 wherein said etchable metal is aluminum.

* * * * *